(12) United States Patent
Imahori et al.

(10) Patent No.: US 6,704,430 B2
(45) Date of Patent: Mar. 9, 2004

(54) ELECTROACOUSTIC TRANSDUCER (75) Inventors: Yoshio Imahori, Shizuoka (JP);
Hiroshi Fujinami, Shizuoka (JP);
Yoshiharu Oishi, Shizuoka (JP);
Takahiro Sone, Shizuoka (JP)

(73) Assignee: Star Micronics Co., Ltd., Shizuoka (JP)

( * ) Notice: Subject to any disclaimer, the term of this patent is extended or adjusted under 35 U.S.C. 154(b) by 0 days.

(21) Appl. No.: 10/315,181

(22) Filed: Dec. 10, 2002

(65) Prior Publication Data
US 2003/0112994 A1 Jun. 19, 2003

(30) Foreign Application Priority Data
Dec. 14, 2001 (JP) ................................ P. 2001-381010

(51) Int. Cl.⁷ ............................................... H04R 25/00
(52) U.S. Cl. ....................... 381/396; 381/409; 381/410; 340/391.1
(58) Field of Search ................ 381/396, 409, 381/410, 394, 386; 340/384.1, 388.1, 391.1; 439/733.1

(56) References Cited

U.S. PATENT DOCUMENTS 6,023,518 A * 2/2000 Kuwabara et al. .......... 381/396
6,476,710 B2 * 11/2002 Togawa et al. ............. 381/396

FOREIGN PATENT DOCUMENTS

JP 2001-242871 9/2001

* cited by examiner

*Primary Examiner*—Huyen Le
(74) *Attorney, Agent, or Firm*—Sughrue Mion, PLLC (57) ABSTRACT An electroacoustic transducer adapted to be mounted on a printed circuit board in which a coil spring is accommodated and supported in a cylindrical recess of a frame while it is fixed to neither a terminal plate nor the frame. Particularly, a protruding pin of the coil spring is passed through a though hole of the terminal plate to allow a leading portion of the protruding pin to be hooked thereon. When the electroacoustic transducer is mounted on the printed circuit board, any horizontal displacement between the compressed spring and the printed circuit board would not cause stress concentration on the coil spring since the coil spring is onlly horizontally shifted in the cylindrical recess until a coil portion of the coil spring hits against the wall of the cylindrical recess.

5 Claims, 8 Drawing Sheets

ELECTROACOUSTIC TRANSDUCER

BACKGROUND OF THE INVENTION

1. Field of the Invention

The present invention relates to an electroacoustic transducer which is adapted to be mounted on a printed circuit board.

2. Description of the Related Art

Many of electroacoustic transducers such as speakers and microphones are adapted to be mounted on a printed circuit board of electronic equipment such as a mobile phone. In such an electroacoustic transducer, a terminal plate is fixed on a casing at a position away from a casing surface opposite the printed circuit board (opposite surface). Then a conductive member is required to allow the terminal plate to be electrically connected to a conductive portion of the printed circuit board.

A coil spring is conventionally known as one of such conductive members. The coil spring is placed between the terminal plate and the conductive portion of the printed circuit board in a resiliently compressed state. See Japanese publication A-2001-242871.

Figure 8A:
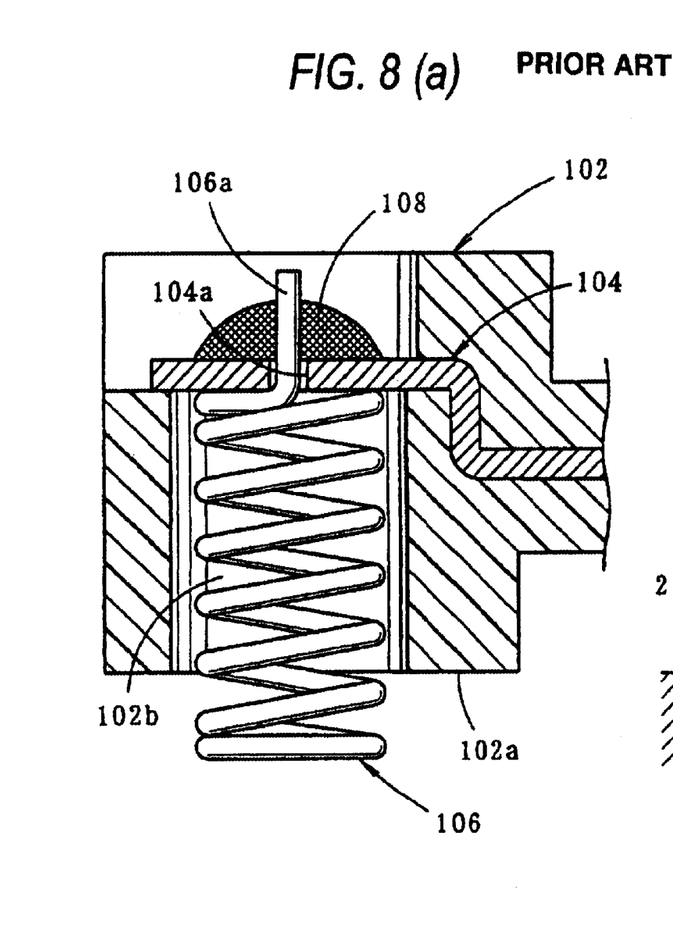
FIG. 8(a) is a prior art showing the same view as FIG. 4(a).

FIG. 8(a) shows part of the conventional electroacoustic transducer having such coil spring. A cylindrical recess 102b is formed on a casing 102, extending from an opposite surface 102b to a terminal plate 104. A through hole 104a is formed on the terminal plate 104 at a position corresponding to the cylindrical recess 102b. A coil spring 106 has a protruding pin 106a extending in the axial direction from an end of the coil spring 106. The protruding pin 106a is passed through the through hole 104a to be fixed to the terminal plate 104 by solder 108.

Such conventional electroacoustic transducer, however, possibly causes a problem as described below depending on how it is mounted on the printed circuit board.

In an assembly of a mobile phone, the top surface of the casing 102 (the counter surface of the opposite surface 102a) of the electroacoustic transducer is adhered to the inner surface of the upper case of the mobile phone by a double-stick tape, and then the electroacoustic transducer and the upper case of the mobile phone are pressed against the printed circuit board to be mounted thereto. It is very likely that the coil spring 106 is horizontally displaced with respect to the printed circuit board, generating stress concentration at the base part of the protruding pin 106a of the coil spring 106.

Figure 8B:
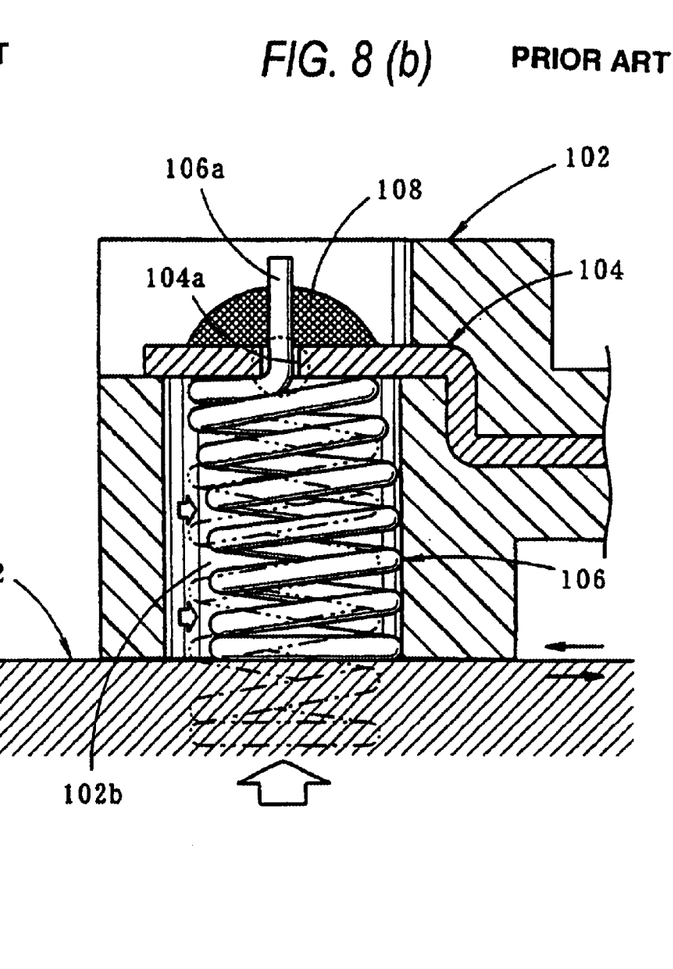
FIG. 8(b) is a prior art showing the same view as FIG. 4(b).

FIG. 8(b) shows a state where the casing 102 is displaced leftward with respect to the printed circuit board 2 with the coil spring 106 resiliently compressed against the printed circuit board 2. The protruding pin 106a soldered to the terminal plate 104 is also displaced leftward as the casing 102 is displaced so. The other end of the coil spring 106, however, remains in the place since it is compressed against the printed circuit board 2. Then the coil spring 106 is suffered from horizontal distortion as shown in the figure, exerting a larger bending moment to the base part of the protruding pin 106a (a surrounded area by dotted line) and generating stress concentration thereon.

The coil spring is likely to be broken during the assembling process, or durability of the coil spring is deteriorated.

SUMMARY OF THE INVENTION

An object of the present invention is to provide an improved structure for accommodating and supporting a coil spring inside the cylindrical recess while fixing it to neither the terminal plate nor the casing.

The present invention relates to an electroacoustic transducer adapted to be mounted on a printed circuit board comprising:

a casing;

a terminal plate fixed on the casing at a position away from a casing surface opposite the printed circuit board; and a coil spring for making electrical connections between the terminal plate and a conductive portion of the printed circuit board when the electroacoustic transducer is mounted on the printed circuit board;

wherein, a cylindrical recess is formed on the casing so as to extend from the casing surface to the terminal plate;

the coil spring has a coil length longer than that of the cylindrical recess by a predetermined dimension, and a coil diameter smaller than the inner diameter of the cylindrical recess by a predetermined dimension; and the coil spring is accommodated and supported in the cylindrical recess while it is fixed to neither the terminal plate nor the casing.

Any type of the "electroacoustic transducer" is applicable such as speaker, buzzer, microphone, and receiver as far as it is adapted to be mounted on the printed circuit board.

Any type of the "printed circuit board" is applicable as far as a conductive portion is formed thereon to make electrical connections with the terminal plate via the coil spring.

Any type of the "casing" is applicable as far as the terminal plate is fixed thereon at a position away from the casing surface opposite the printed circuit board. The "casing surface opposite the printed circuit board" is a surface facing the printed circuit board when the electroacoustic transducer is mounted on the printed circuit board. After the electroacoustic transducer is mounted on the printed board, the surface may be contact with the printed circuit board or may be away from it by certain distance.

Any type of the "cylindrical recess" is applicable as far as it extends from the casing surface opposite the printed circuit board to the terminal plate. It does not always require a circumferential wall formed entirely.

Any type of the "coil spring" is applicable as far as it is made of conductive material and it is accommodated and supported in the cylindrical recess while it is fixed to neither the terminal plate nor the casing. The phrase "accommodated and supported in the cylindrical recess" means that the coil spring does not come off the cylindrical recess in a no-load state and part of the coil spring is accommodated in the cylindrical recess. The coil spring is supported but fixed to neither the terminal plate nor the casing.

The "coil length" is not limited to a specific value. It may be any value as far as it is longer than the length of the cylindrical recess and long enough for surely making electrical connections between the terminal plate and the conductive portion of the printed circuit board when resiliently compressed. The "coil diameter" is not limited to a specific value. It may be any value as far as it is smaller than the inner diameter of the cylindrical recess and it allows the coil spring to be compressed and shifted in the cylindrical recess.

According to the present invention, since the coil spring is accommodated and supported in the cylindrical recess while it is fixed to neither the terminal plate nor the casing, the coil spring is free from any stress concentration even if external force is exerted.

In state that the coil spring is pressed against the printed circuit board, any horizontal displacement between them would not cause stress concentration on the coil spring since the coil spring is only horizontally shifted in the cylindrical recess until the coil portion hits against the wall of the cylindrical recess. This prevents a breakage of the coil spring during the assembling process and also a possible deterioration thereof after the assembling process.

As described above, breakage or damage of the coil spring is prevented even when it is used as a conductive member for making electrical connections between the terminal plate and the conductive portion of the printed circuit board, The present invention eliminates the need for soldering of the coil spring to the terminal plate, simplifying the manufacturing process of the electroacoustic transducer.

The present invention eliminates the need for positioning of the coil spring with respect to the cylindrical recess to insert the protruding pin into the through hole for soldering, simplifying the manufacturing process of the electroacoustic transducer.

The present invention eliminates the risk of soldering heat which is likely to deform the resin members or portions near the terminal plate.

Eliminating the need for soldering provides an environmental PB-free product.

According to the present invention, a through hole is formed on the terminal plate at an exposed portion above the cylindrical recess. The inner diameter of the through hole is larger than a wire diameter of the coil spring by a predetermined dimension. A protruding pin is axially extended from the coil spring at the side of the terminal plate to be passed though the through hole of the terminal plate, and the leading portion of the protruding pin is bent.

By bending the leading portion, the protruding pin is hooked on the terminal plate, thus preventing the coil spring from coming off the cylindrical recess. The coil spring is accommodated and supported in the cylindrical recess with an extremely simple structure.

The "predetermined dimension" is not limited to a specific value. In order to definitely guard against a horizontal distortion of the coil spring, however, the dimension is desirably set to such value as to prevent the protruding pin from hitting against the wall of the through hole until the coil portion hits against the wall of the cylindrical recess.

According to the present invention, a through hole is formed on the terminal plate at an exposed portion above the cylindrical recess. The inner diameter of the through hole is larger than a wire diameter of the coil spring by a predetermined dimension. A protruding pin is axially extended from the coil spring at the side of the terminal plate to be passed though the through hole of the terminal plate. A ring member is disposed between the terminal plate and a leading portion of the protruding pin, having a center hole of smaller diameter than the through hole for allowing the protruding pin to pass through. The leading portion of the protruding pin is hooked or fixed on the ring member.

The leading portion of the protruding pin may be bent to be hooked on the ring member. Alternatively, the leading portion may be adhered to the ring member. Interposing the ring member eliminates the need for bending the leading portion at a great deal of angle, thus effectively preventing the protruding pin from coming off the terminal plate.

According to the present invention, the coil diameter of the coil spring may be smaller at the side of the printed circuit board than at the side of the terminal plate. A ring portion may be provided in the cylindrical recess at the side of the printed circuit board to make the inner diameter of the cylindrical recess smaller than the coil diameter at the side of the terminal plate.

This structure eliminates the need for a through hole in the terminal plate. The embodiments include the following structures. The coil spring may be gradually reduced in diameter from the side of the terminal plate to the side of the printed circuit board. The coil spring may be tapered in diameter from the side of the terminal plate to the side of the printed circuit board. The coil spring may comprise a cylindrical portion at the side of the terminal plate and a tapered portion at the side of the printed circuit board.

The ring portion may be separately provided or may be integrally formed with the casing by plastic deformation of the casing. When a separate ring member is used, it is press fit into the cylindrical recess.

DETAILED DESCRIPTION OF THE INVENTION

The present invention is being described with reference to the drawings.

Figure 1:
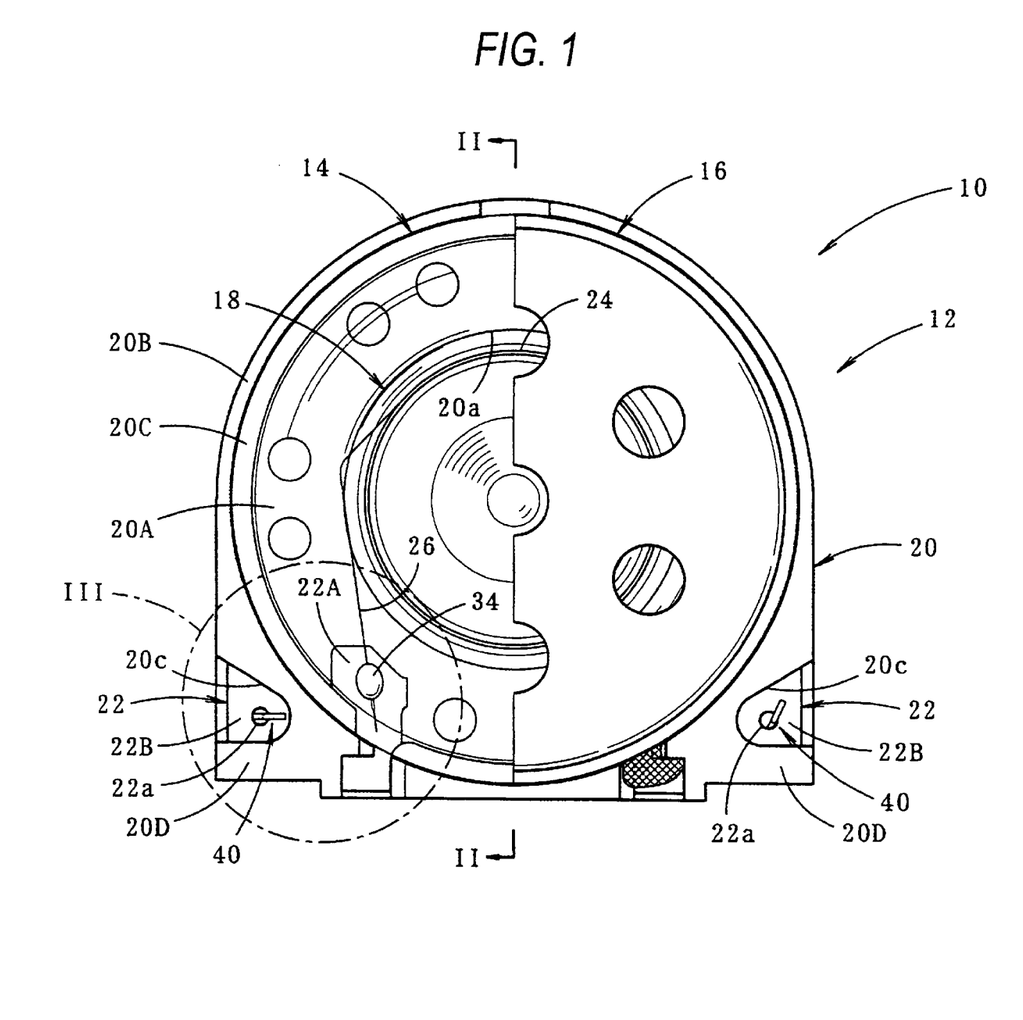
FIG. 1 is a top view of an electroacoustic transducer of an embodiment of the present invention.
Figure 2:
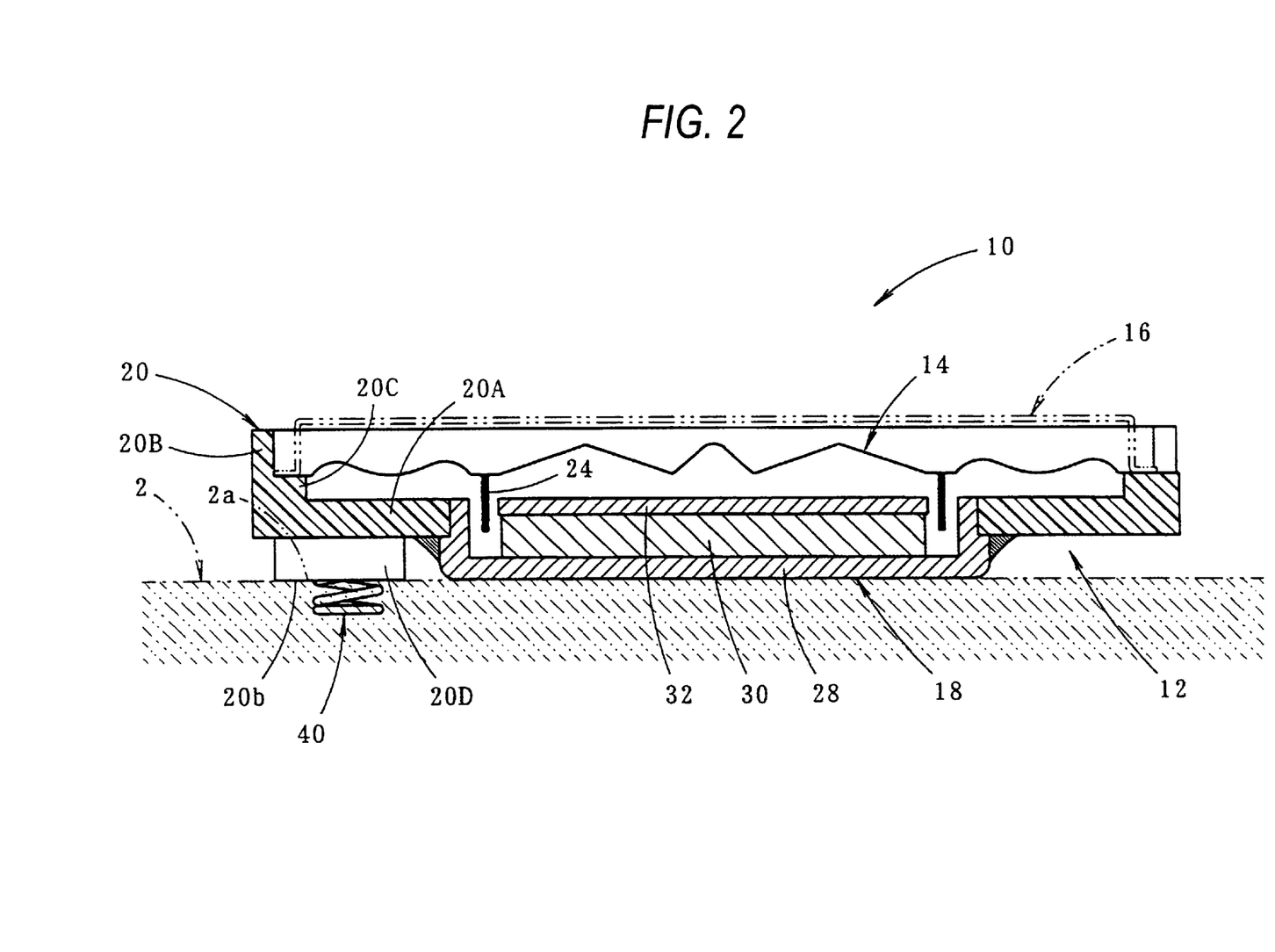
FIG. 2 is a sectional view seen from the II—II line in FIG. 1.
Figure 3:
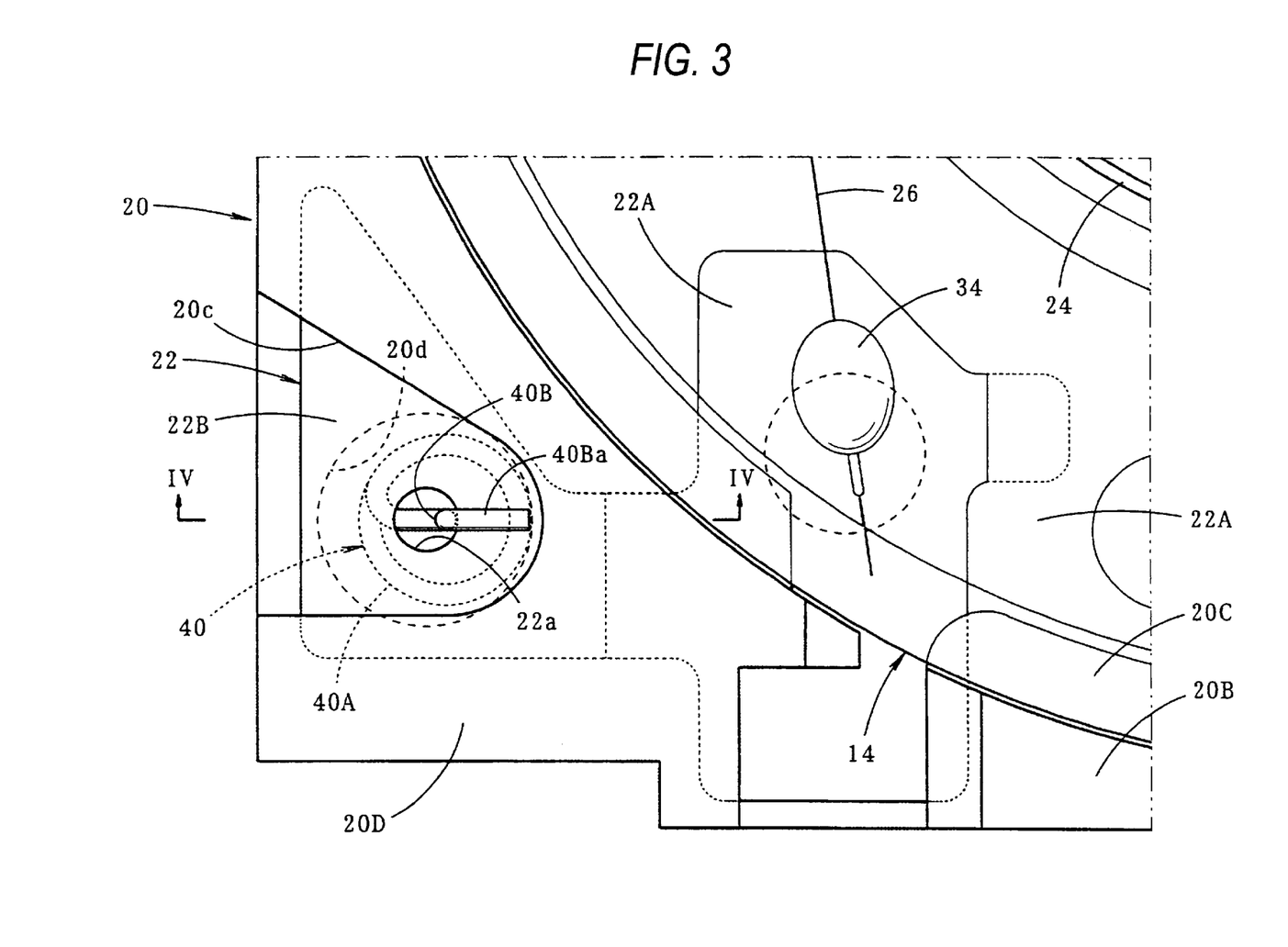
FIG. 3 is an exploded view of the III section in FIG. 1.

FIG. 1 is a top view of an electroacoustic transducer 10 of an embodiment of the present invention. FIG. 2 is a sectional view seen from the II—II line in FIG. 1. FIG. 3 is an exploded view of the III—III section in FIG. 1.

The electroacoustic transducer 10 of the present embodiment is a miniature dynamic speaker having a diameter of approx. 15 to 20 mm which is to be mounted on a printed circuit board 2 of a mobile phone or other electronic equipment.

The electroacoustic transducer 10 comprises a frame subassembly 12, a diaphragm 14 and a cover 16 mounted thereon from above, and a magnetic circuit unit 18 mounted thereon from below.

The frame subassembly 12 comprises a frame (casing) 20, a pair of terminal plates, and a voice coil 24.

The frame 20 is made of polyamide synthetic resin by injection molding. The frame 20 comprises a circular opening 20a formed in the center, an annular bottom portion 20A surrounding the circular opening 20a, and a circumferential wall portion 20B extending upward from the circumferential edge of the annular bottom portion 20A. Inside the circumferential wall portion 20B, there is formed a stepped portion higher than the annular bottom portion 20A. Outside the circumferential wall portion 20B, there is extended a pair of terminal embedding portions 20D of an angulated shape.

The lower surface of the frame 20 is coplanar with the lower surface of the magnetic circuit unit 18 at the pair of terminal embedding portions 20D while the former is higher than the latter for the remaining part of the frame 20. A lower surface of the frame 20 at the terminal embedding portion 20D is a surface opposite a conductive portion 2a of a printed circuit board 2 (an opposite surface 20b), which is a surface pressed against the conductive portion 2a when the electroacoustic transducer 10 is mounted on the printed circuit board 2.

The pair of terminal plates 22 is made of metal by pressing and bending and integrally formed with the frame 20 by insert molding. The terminal plate 22 is extended from the annular bottom portion 20A to the pair of terminal embedding portions 20D.

Part of the terminal plate 22 on the side of the annular bottom portion 20A constitutes a land portion 22A extending on the upper surface of the annular bottom portion 20A. Other part of the terminal plate 22 on the side of the terminal embedding portion 20D extends at a higher level than the land portion 22A so as to be embedded in the frame 20 with part thereof exposed on the frame 20.

Part of the terminal embedding portion 20D is cut away in the shape of a near triangle above the terminal plate 22 to constitute a notched portion 20c. Part of the terminal plate 22 is exposed through the notched portion 20c to constitute an exposed portion 22B. Formed below the exposed portion 22B is a cylindrical recess 20 extending from the opposite surface 20b to the terminal plate 22. A circular through hole 22a is formed on the terminal plate 22 at the center of the cylindrical recess 20d. A coil spring 40 is accommodated and supported in the cylindrical recess 20d while it is fixed to neither the terminal plate nor the frame 20 (described later).

The voice coil 24 is disposed within the circular opening 20a so that the upper end thereof is coplanar with the upper surface of the annular stepped portion 20D. A pair of lead wires 26 is drawn from the upper end of the voice coil 24, and a portion near the leading end of the lead wire 26 is conductively fixed to the land portion 22A of the terminal plate 22 by thermocompression. The land portion 22A where the lead wire 26 is fixed is covered by an overcoat 34.

A diaphragm 14 is made of polyetherimide resin film by thermal pressing, so as to have a plurality of concavity and convexity concentric to each other. The diaphragm 14 comprises a circumferential flat portion adhered to the upper surface of the annular stepped portion 20C and an intermediate flat portion adhered to the upper end of the voice coil 24.

The cover 16 is a press molded member of a metal plate of stainless steel, having an annular flange adhered to the circumferential flat portion of the diaphragm 14 and the upper surface of the annular stepped portion 20C.

The magnetic circuit unit 18 comprises a steel base 28, a magnet 30 and a steel yoke 20. It is fixed to the frame 20 by adhesive.

Figure 4:
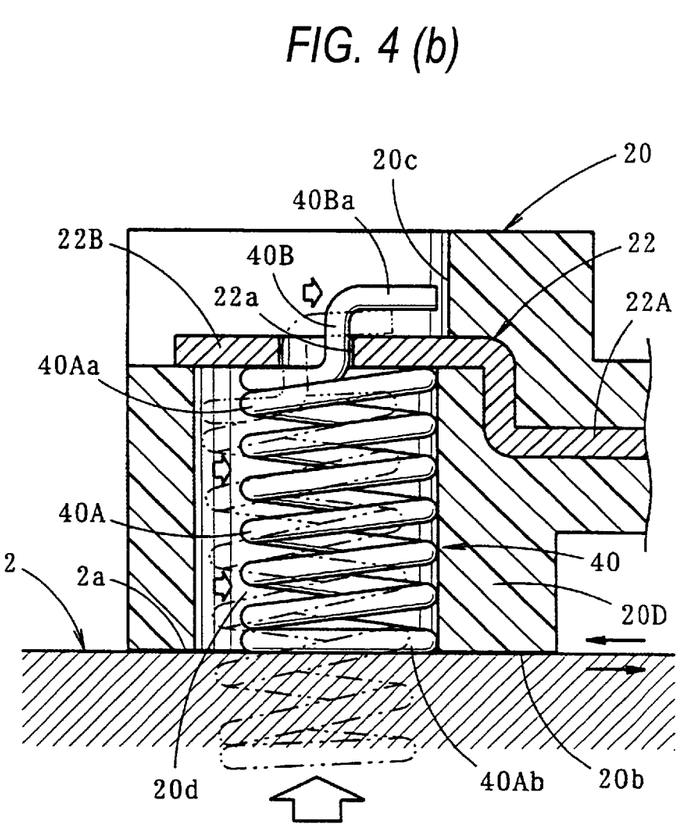
FIG. 4(a) is a sectional view seen from the IV—IV line in FIG. 3.
FIG. 4(b) is a sectional view seen from the IV—IV line in FIG. 3 showing that the electroacoustic transducer is mounted on the printed circuit board.

FIG. 4 is a sectional view seen from the IV—IV line in FIG. 3. FIG. 4(a) shows the electroacoustic transducer before it is mounted on the printed circuit board. FIG. 4(b) shows the electroacoustic transducer after it is mounted on the printed circuit board.

Since the structure of the coil spring 40 and the neighborhood is identical for both sides of the electroacoustic transducer 10, only the coil spring 40 on the left side is being described below.

The coil spring 40 comprises a coil portion 40A and a protruding pin 40B extending upward from the center of the upper end 40Aa (on the side of the terminal plate 22) of the coil portion 40A.

The length of the coil portion 40A is longer than the length of the cylindrical recess 20d by a predetermined dimension. The outer diameter of the coil portion 40A is smaller than the inner diameter of the cylindrical recess 20d by a predetermined dimension. The protruding pin 40B extends upward through the through hole 22a of the terminal plate 22 with the leading portion 40Ba thereof bent at substantially right angles.

As shown in FIG. 4(a), the coil spring 40 is not subject to load before the electroacoustic transducer 10 is mounted on the printed circuit board 2. The coil spring 40 hangs inside the cylindrical recess 20d as the protruding pin 40B is hooked on the terminal plate 22. The inner diameter of the through hole 22a is set to an appropriate dimension to prevent the protruding pin 40B from hitting against the wall of the through hole 22a until the coil portion 40A hits against the wall of the cylindrical recess 20d when the coil spring 40 is horizontally shifted. The leading portion 40Ba of the protruding pin 40B has an appropriate length to prevent the protruding pin 40B from dropping out of the through hole 22a.

As shown in FIG. 4(b), when the elctroacoustic transducer 10 is mounted on the printed circuit board 2, the coil spring 40 is in resiliently compressed state. The upper end 40Aa and the lower end 40Ab of the coil spring 40A are pressed against the terminal plate 22 and the conductive portion 2a of the printed circuit board 2 respectively. The coil spring 40 makes electrical connections between the terminal plate 22 and the conductive portion 2a.

As described above, when the electroacoustic transducer 10 is mounted on the printed circuit board 2, it is very likely in prior arts that a horizontal displacement occurs between the coil spring 40 and the printed circuit board 2.

In the electroacoustic transducer 10 of the present invention, however, the coil spring is never subject to concentrated load even if external force is exerted since it is accommodated and supported in the cylindrical recess 20d while it is fixed to neither the terminal plate 22 nor the frame 20.

If horizontal displacement occurs between the coil spring 40 and the printed circuit board 2 in state where the coil spring 40 is pressed against the printed circuit board 2, the coil spring 40 is only horizontally shifted until the coil portion 40A hits against the wall of the cylindrical recess 20d. No deformation of the coil spring 40 would occur and no stress concentration would be applied to part of the coil spring 40. This prevents a breakage of the coil spring 40 during the assembling process and also prevents deterioration thereof after the assembling process.

According to this embodiment, the coil spring 40 is protected from breakage or deterioration even if it is used as a conductive member for coupling the terminal plate 22 and the conductive portion 2a of the printed circuit board 2.

Further, there is no need for soldering of the coil spring 40 to the terminal plate 22, simplifying the manufacturing process of the electroacoustic transducer 10. There is also no need for positioning of the coil spring 40 with respect to the cylindrical recess 20d to insert the protruding pin into the though hole for soldering, further simplifying the manufacturing process. Eliminating the soldering process provides an environmental Pb(plumb)-free product and also prevents any possible deformation of the resin member or portion (such as the frame 20 and the diaphragm 14) by soldering heat.

The through hole 22a is formed on the terminal plate 22 at the center of the cylindrical recess 20d, having a larger inner diameter than the wire diameter of the coil spring 40 by a predetermined dimension. The protruding pin 40B is extended upward from the upper end of the coil portion 40A to be passed though the through hole 22a. The leading portion 40Ba of the protruding pin 40B is bent at substantially right angles to be hooked on the terminal plate 22. This structure prevents the coil spring 40 from coming off the cylindrical recess 20d, enabling a support of the coil spring 40 inside the cylindrical recess 20d with an extremely simple structure. Further, the through hole 22a has such dimension as to prevent the protruding pin 40B from hitting against the wall of the through hole 22a until the coil portion 40A hits against the wall of the cylindrical recess 20d when the coil spring 40 is horizontally shifted. It never causes deformation of the coil spring 40.

Figure 5:
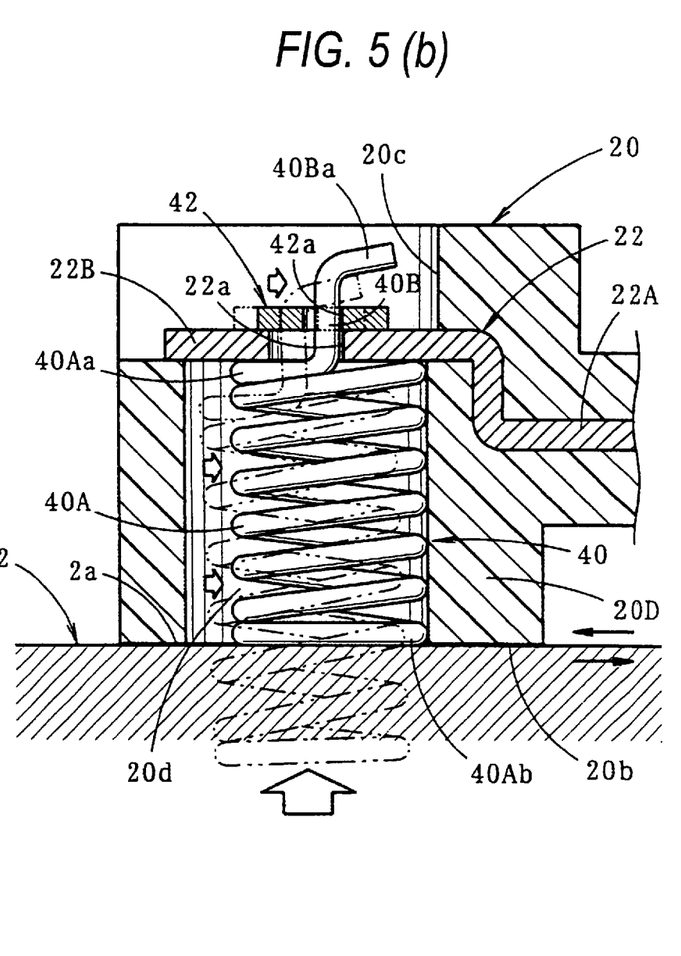
FIG. 5(a) is a second embodiment of the present invention showing the same view as FIG. 4(a).
FIG. 5(b) is a second embodiment of the present invention showing the same view as FIG. 4(b).

A second embodiment comprises, as shown in FIG. 5(a), an ring plate 42 which is disposed between the terminal plate 22 and the leading portion 40Ba of the protruding pin 40B. The ring plate 42 has a center hole 42a of smaller diameter than the through hole 22a. Since the protruding pin 40B is passed through the center hole 42a, it does not come off the through hole 22a. Providing the ring plate 42 eliminates the need for bending the leading portion 40Ba at substantially right angles. The leading portion 40Ba may be bent or alternatively fixed to the ring plate 42 by adhesive.

When horizontal displacement occurs between the coil spring 40 and the printed circuit board 2 as shown in FIG. 5(b), the coil spring 40 is only horizontally shifted until the coil portion 40A hits against the wall of the cylindrical recess 20d. The same advantage is then obtained as in the first embodiment.

Figure 6:
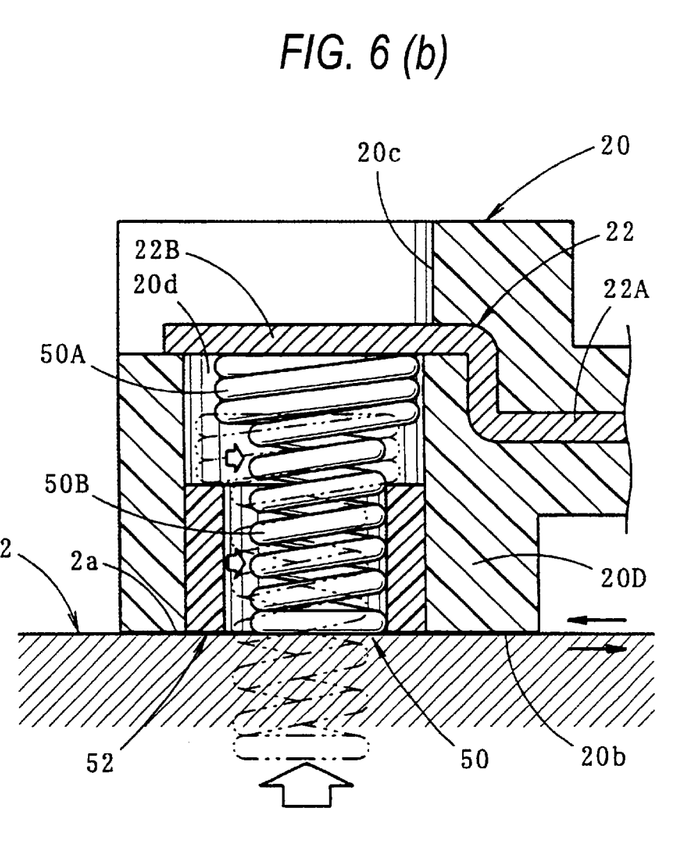
FIG. 6(a) is a third embodiment of the present invention showing the same view as FIG. 4(a).
FIG. 6(b) is a third embodiment of the present invention showing the same view as FIG. 4(b).

A third embodiment comprises, as shown in FIG. 6(a), a coil spring 50 having a larger diameter portion 50A and a smaller diameter portion 50B. A ring member 52 having a smaller inner diameter than the larger diameter portion 50A is press fit into the cylindrical recess 20d at the bottom. The coil spring 50 is thereby supported in the cylindrical recess while it is fixed to neither the terminal plate 22 nor the frame 20. In this embodiment, the through hole 22a is not necessary.

When horizontal displacement occurs between the coil spring 50 and the printed circuit board 2 as shown in FIG. 6(b), the coil spring 50 is horizontally shifted until the smaller diameter portion 50B hits against the wall of the ring member 52. The same advantage is then obtained as in the first and second embodiments. The coil spring 50 and the ring member 52 may be so designed in shape that the larger diameter portion 50A hits against the wall of the cylindrical recess 20d when the coil spring 50 is horizontally shifted.

Figure 7:
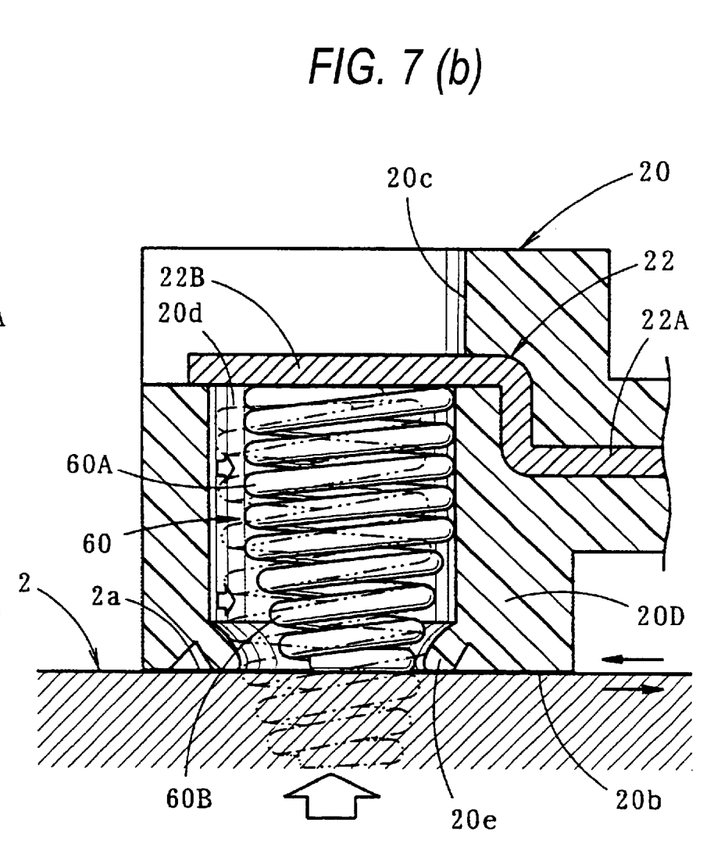
FIG. 7(a) is a fourth embodiment of the present invention showing the same view as FIG. 4(a).
FIG. 7(b) is a fourth embodiment of the present invention showing the same view as FIG. 4(b).

A fourth embodiment comprises, as shown in FIG. 7(a), a coil spring 60 having a cylindrical portion 60A and a tapered portion 60B. The tapered portion 60B becomes gradually reduced in diameter toward the bottom.

Instead of the ring member 52, the frame 20 may be deformed to have a ring portion 20e swollen into the cylindrical recess 20d at the opposite surface 20b. The ring portion 20e achieves the same advantage as the separate ring member 52 and further contributes to cost reduction due to elimination of a separate component. Plastic deformation of the frame 20 to form the ring portion 20e is available by an ultrasonic horn 4 having an annular wedge-shaped leading end. The ultrasonic horn 4 is pressed against the opposite surface 20b at the cylindrical recess 20d.

When horizontal displacement occurs between the coil spring 60 and the printed circuit board 2 as shown in FIG. 7(b), the coil spring 60 is horizontally shifted until the cylindrical portion 60A hits against the wall of the cylindrical recess 20d. The same advantage is then obtained as in the first to third embodiments.

The coil springs 40, 50 and 60 may be gold plated to improve conductivity. Part of the terminal plate 22 exposed on the cylindrical recess 20d may be gold plated to further improve conductivity.

What is claimed is:

1. An electroacoustic transducer adapted to be mounted on a printed circuit board comprising:

a casing;

a terminal plate fixed to the casing at a position away from a casing surface opposite the printed circuit board; and a coil spring for making electrical connections between the terminal plate and a conductive portion of the printed circuit board when the electroacoustic transducer is mounted on the printed circuit board;

wherein, a cylindrical recess is formed on the casing so as to extend from the casing surface to the terminal plate;

the coil spring has a coil length longer than that of the cylindrical recess by a predetermined dimension, and a coil diameter smaller than the inner diameter of the cylindrical recess by a predetermined dimension;

the coil spring is accommodated and supported in the cylindrical recess while it is fixed to neither the terminal plate nor the casing; and the coil spring is horizontally shifted until the coil portion hits against a wall of the cylindrical recess when horizontal displacement occurs in the coil spring.

2. The electroacoustic transducer as claimed in claim 1, wherein a through hole is formed on the terminal plate at an exposed portion above the cylindrical recess;

the inner diameter of the through hole is larger than a wire diameter of the coil spring by a predetermined dimension;

a protruding pin is axially extended from the coil spring at the side of the terminal plate to be passed though the through hole of the terminal plate;

the leading portion of the protruding pin is bent; and the coil spring is brought into movable contact with the terminal plate.

3. An electroacoustic transducer adapted to be mounted on a printed circuit board comprising:

a casing;

a terminal plate fixed to the casing at a position away from a casing surface opposite the printed circuit board; and a coil spring for making electrical connections between the terminal plate and a conductive portion of the printed circuit board when the electroacoustic transducer is mounted on the printed circuit board;

wherein a cylindrical recess is farmed on the casing so as to extend from the casing surface to the terminal plate;

the coil spring has a coil length longer than that of the cylindrical recess by a predetermined dimension and a coil diameter smaller than the inner diameter of the cylindrical recess by a predetermined dimension;

the coil spring is accommodated and supported in the cylindrical recess while it is fixed to neither the terminal plate nor the casing;

a through hole is formed on the terminal plate at an exposed portion above the cylindrical recess;

the inner diameter of the through hole is larger than a wire diameter of the coil spring by a predetermined dimension;

a protruding pin is axially extended from the coil spring at the side of the terminal plate to be passed though the through hole of the terminal plate;

a ring member is disposed between the terminal plate and a leading portion of the protruding pin;

the ring member has a center hole of smaller diameter than the through hole for allowing the protruding pin to pass through; and the leading portion of the protruding pin is hooked or fixed on the ring member.

4. An electroacoustic transducer adapted to be mounted on a printed circuit board comprising:

a casing;

a terminal plate fixed to the casing at a position away from a casing surface opposite the printed circuit board; and a coil spring for making electrical connections between the terminal plate and a conductive portion of the printed circuit board when the electroacoustic transducer is mounted on the printed circuit board;

wherein, a cylindrical recess is formed on the casing so as to extend from the casing surface to the terminal plate;

the coil spring has a coil length longer than that of the cylindrical recess by a predetermined dimension and a coil diameter smaller than the inner diameter of the cylindrical recess by a predetermined dimension;

the coil spring is accommodated and supported in the cylindrical recess while it is fixed to neither the terminal plate nor the casing;

the coil diameter of the coil spring is smaller at the side of the printed circuit board than at the side of the terminal plate; and a ring portion is provided in the cylindrical recess at the side of the printed circuit board to make the inner diameter of the cylindrical recess smaller than the coil diameter at the side of the terminal plate.

5. The electroacoustic transducer as claimed in claim 4, wherien the ring poriton is integrally formed with the casing by plastic deformation of the casing.

* * * * *